United States Patent [19]

Tsukuda

[11] 4,361,846
[45] Nov. 30, 1982

[54] LATERAL TYPE SEMICONDUCTOR DEVICES WITH ENLARGED, LARGE RADII COLLECTOR CONTACT REGIONS FOR HIGH REVERSE VOLTAGE

[75] Inventor: Kiyoshi Tsukuda, Hitachi, Japan

[73] Assignee: Hitachi, Ltd., Tokyo, Japan

[21] Appl. No.: 176,207

[22] Filed: Aug. 7, 1980

Related U.S. Application Data

[63] Continuation of Ser. No. 964,820, Nov. 30, 1978, abandoned.

[30] Foreign Application Priority Data

Dec. 5, 1977 [JP] Japan .................................. 52-144982

[51] Int. Cl.³ ........................................... H01L 29/06
[52] U.S. Cl. ...................................... 357/20; 357/13; 357/35; 357/36; 357/38; 357/49
[58] Field of Search ...................... 357/20, 35, 36, 49, 357/13, 38

[56] References Cited

U.S. PATENT DOCUMENTS

| | | | |
|---|---|---|---|
| 3,461,360 | 8/1969 | Barson et al. | 357/35 |
| 3,651,565 | 3/1972 | Talbert | 357/35 |
| 3,832,732 | 8/1974 | Roberts | 357/35 |
| 3,878,551 | 4/1975 | Callahan | 357/35 |
| 3,898,483 | 8/1975 | Sander et al. | 357/38 |
| 3,958,264 | 5/1976 | Magdo | 357/20 |
| 3,971,060 | 7/1976 | Leuschner | 357/51 |
| 4,079,403 | 3/1978 | Temple | 357/13 |
| 4,099,998 | 7/1978 | Ferro et al. | 357/13 |
| 4,131,809 | 12/1978 | Baars | 357/51 |
| 4,193,836 | 3/1980 | Youmans et al. | 357/51 |
| 4,228,451 | 10/1980 | Priel et al. | 357/51 |

FOREIGN PATENT DOCUMENTS 906667  8/1972  Canada .................................. 357/35

OTHER PUBLICATIONS

D. Fleming et al., "Open–Collector Structure Lateral PNP Transistor," IBM Tech. Discl. Bull., vol. 19, #2, Jul. 1976, pp. 569–570.

Primary Examiner—Joseph E. Clawson, Jr.
Attorney, Agent, or Firm—Antonelli, Terry & Wands

[57] ABSTRACT

Lateral type semiconductor devices are provided which can withstand a high applied reverse voltage and can be effectively employed in semiconductor integrated circuits with an enhanced integration density. These lateral type semiconductor devices include therein an island region formed in a semiconductor supporting region and a diffusion region formed in the island region. The radius of curvature at the pn junction surface of the diffusion region is selected to be at least 1.5 times larger than the depth of the diffusion region. The diffusion region includes electrode mounting portions of large area and the remaining portions having the form of a fine line.

12 Claims, 9 Drawing Figures xj = 15 μm

LATERAL TYPE SEMICONDUCTOR DEVICES WITH ENLARGED, LARGE RADII COLLECTOR CONTACT REGIONS FOR HIGH REVERSE VOLTAGE

This is a continuation of application Ser. No. 964,820, filed Nov. 30, 1978, now abandoned.

The present invention relates to semiconductor devices suitable for use in semiconductor integrated circuits which can withstand high applied voltages and also have high integration densities.

For transistors and thyristors in semiconductor integrated circuits, there are generally employed the so-called lateral type semiconductor devices made in the planar shape. Each of the lateral type semiconductor devices includes a monocrystalline semiconductor island region contained in a semiconductor supporting region but isolated therefrom by means of a pn junction or a dielectric isolation, a diffusion region formed in the island region, and electrodes required. The withstand-voltage characteristic of such semiconductor devices is determined by the reverse blocking voltage of the pn junction formed between the semiconductor island region and the diffusion region. However, the reverse blocking voltage is dependent upon the shape of the diffusion region. That is, each corner of the diffusion region is subjected to the electric field concentration, which deteriorates the withstand-voltage capability of the devices.

Figure 1:
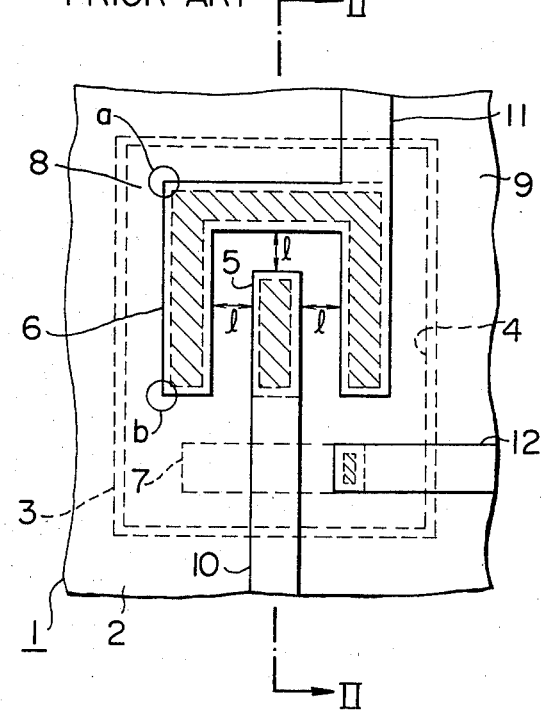
FIG. 1 is a plan view of a semiconductor integrated circuit including therein conventional lateral type pnp transistors.
Figure 2:
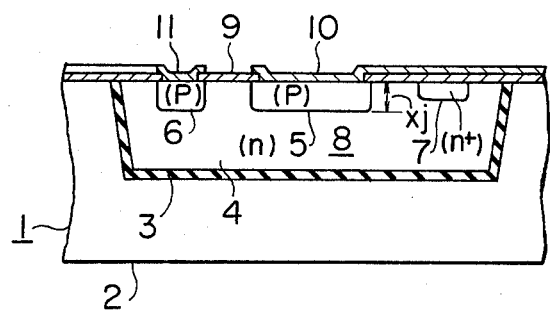
FIG. 2 is a longitudinal sectional view of the above-mentioned integrated circuit, taken along the line II—II of FIG. 1.

Referring to FIGS. 1 and 2 showing a conventional, lateral type transistor, 1 indicates a dielectric isolated semiconductor substrate which makes up one member of a semiconductor integrated circuit. The substrate 1 includes therein a polycrystalline semiconductor supporting region 2, a dielectric film 3 made of $SiO_2$, $Si_3N_4$, or the like, and a monocrystalline semiconductor island region 4. The monocrystalline semiconductor island region 4 having the n-type conductivity includes therein an emitter region 5 of p-type conductivity located at the center of the island, a collector region 6 of p-type conductivity surrounding the emitter region 5 in a U-shaped fashion, and a base region 7 of $n^+$-type conductivity. Regions 5, 6 and 7 are formed by diffusing p and n type impurities into one of the main surfaces, namely, the upper main surface of the substrate. The remaining region 8 of the monocrystalline semiconductor island region 4, which is not subjected to any diffusion and thus has the original n-type conductivity, behaves as the base region. On the upper surface of the substrate 1, there is formed a passivation film 9 of $SiO_2$ which has apertures at respective appropriate positions on the emitter, collector and base regions 5, 6 and 7. Emitter, collector and base electrodes 10, 11 and 12 formed through conventional techniques such as vacuum evaporation techniques are kept in ohmic contact with the surface at the above positions. Hatched areas depicted in FIG. 1 indicate ranges in which the above electrodes 10, 11 and 12 can be in contact with the emitter, collector and base regions 5, 6 and 7, respectively. Each of the regions 5, 6 and 7 may be connected, by means of corresponding one of the electrodes 10, 11 and 12 prolonged on the passivation film 9, with a circuit element (not shown) formed in another monocrystalline semiconductor island region and with an external circuit (not shown).

In order for the lateral type semiconductor device having such a structure to be able to withstand higher applied voltages, it is required to make high the resistivity of the semiconductor substrate, especially, that of the island region 4, and to elongate the distances between regions, especially, the distance l between the emitter region 5 and the collector region 6. On the other hand, in such a semiconductor device, the pn junction subjected to almost all the part of the applied voltage, for example, the collector junction formed between collector region 6 and base region 8, gives rise to an electric field concentration at its outward corners (corners projecting towards the outside), namely, at a and b portions shown in FIG. 1, and thus the withstand voltage capability is deteriorated. In view of the above fact, the outward corners are so formed as to have a roundish shape, and thereby the electric field concentration may be alleviated. The pn junction having such a shape is usually made by increasing the depth $x_j$ of the diffusion layer for forming the pn junction. However, the deep diffusion layer for attaining a high withstand-voltage, causes drawbacks as mentioned below. The collector region 6 becomes much larger in area than required, that is, the device is made large-sized. Therefore, it becomes impossible for the device to be employed in a semiconductor integrated circuit with a reduced integration density. Further, the electrostatic capacity at the junction is increased, and thus the high withstand-voltage can't be attained.

An object of the present invention is to provide a lateral type semiconductor device which can eliminate the drawbacks of conventional semiconductor devices, exhibit a high withstand-voltage, and improve the integration density when used in semiconductor integrated circuits.

Figure 3A:
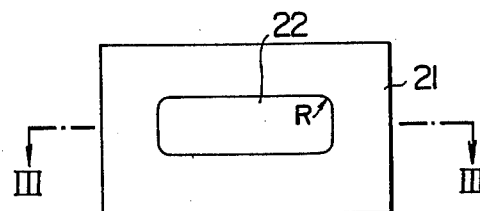
FIGS. 3A and 3B are a plan view of a semiconductor device used for experiments with respect to the present invention and a longitudinal sectional view of the device, taken along the line III—III of FIG. 3A, respectively.
Figure 3B:
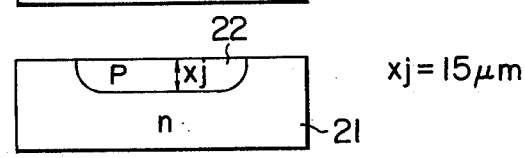
Figure 4:
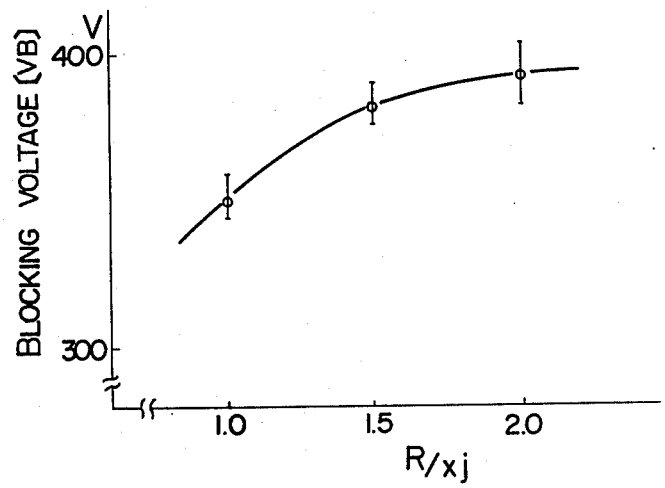
FIG. 4 is a graph showing a withstand-voltage characteristic curve of the semiconductor device shown in FIGS. 3A and 3B.

The inventor of the present application paid his attention to the relationship between the roundness of the outward corners indicated by a and b in FIG. 1 and the blocking voltage of the pn junction, and made experiments as mentioned below. Referring to FIG. 3A, reference numeral 21 indicates an n-type semiconductor body having a resistivity of 15 $\Omega$-cm, and 22 indicates a diffusion region of p-type conductivity the depth $x_j$ of which is 15 $\mu$m. The reverse blocking voltage was measured for each of the semiconductor devices which have the structure shown in FIGS. 3A and 3B and are different from each other in radius of curvature R at the outward corners of p-type diffusion region 22. FIG. 4 shows a relationship between the blocking voltage and the curvature at the outward corners of the diffusion region. Experimental results represented in FIG. 4 point out the following facts clearly. In the relationship between the blocking voltage and the radius of curvature of the pn junction appearing in the plan view of the semiconductor device, the blocking voltage rises with an increase in the radius of curvature, but is not increased in a range of radius of curvature exceeding a constant value. While, when the ratio of the radius of curvature to the depth of pn junction is considered, the saturation of blocking voltage starts at a ratio approximately equal to 1.5. In other words, the almost highest value for the blocking voltage can be obtained by selecting, for the radius of curvature of outward corners (a and b) of collector region 6 in FIG. 1, an appropriate value which is at least 1.5 times larger than the depth $x_j$ of collector region 6. However, when collector region 6 is simply formed in the above-mentioned manner, the integration density is lowered as mentioned previously. Further, the electrostatic capacity of pn junction is increased, and thus the blocking voltage is not improved. To obviate the above drawbacks, in the present invention, an impurity diffusion region is made in the form of a fine line, as compared with conventional one.

The present invention based upon the foregoing consideration is characterized in that, for lateral type semiconductor devices, the impurity diffusion region withstanding a high applied voltage is formed in such a manner that the remaining portions of the impurity diffusion region other than an electrode mounting portion have the form of a fine line in the plan view, and in that the minimum radius of curvature at outward corners of the impurity diffusion region is selected to be approximately 1.5 times larger than the depth of diffusion for forming pn junctions.

Now, the present invention will be explained in connection with embodiments shown in the drawings.

Figure 5:
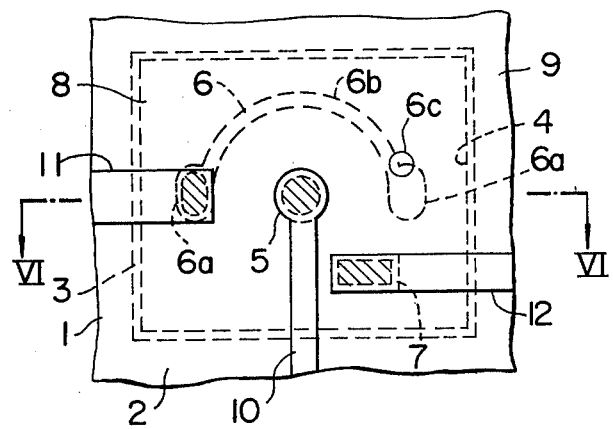
FIG. 5 is a plan view of a semiconductor integrated circuit including therein pnp transistors according to the present invention.
Figure 6:
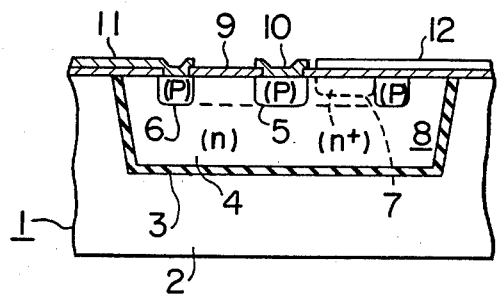
FIG. 6 is a longitudinal sectional view of the above-mentioned integrated circuit, taken along the line VI—VI of FIG. 5.

Referring to FIGS. 5 and 6, in which like reference numerals are used for like or equivalent parts having been indicated in FIGS. 1 and 2, there is shown a lateral type pnp transistor including an emitter region 5 of p-type conductivity, a base region 8 of n-type conductivity, and a collector region 6 of p-type conductivity. The collector junction, which is a pn junction formed between collector region 6 and base region 8 and is subjected to a greater part of an applied voltage, has at its outward corners being adapted to have a radius of curvature approximately 1.5 times larger than the depth of the pn junction, in order to avoid the electric field concentration at these corners. Incidentally, the electric field concentration does not appear at an inward corner such as indicated by 6C, and therefore it is not required to take a large radius of curvature at the inward corner. Further, n+-type base region 7 is provided only for mounting a base electrode, and has no connection with the withstand-voltage capability. Therefore, consideration need not be taken with respect to the radius of curvature of base region 7. Collector region 6, which is an impurity diffusion region, has a required area at electrode mounting portion 6a provided for an electric current flow, but the remaining portion 6b of collector region 6 other than electrode mounting portion 6a is made in the form of a fine line or strip to reduce the junction area of collector junction. The reduced junction area produces a low electrostatic capacity at the junction, and thus can improve the withstand-voltage capability. Further, since the remaining portion 6b other than electrode mounting portion 6a is made thin, the area required for island region 4 becomes small, and thus the pnp transistor having such a structure may be used in semiconductor integrated circuits with an improved integration density. The area of the collector region 6 according to the present invention is reduced to about one half as compared with that of the prior art, with the result that the integration density improvement of about 20 percents is attained as compared with the prior art. Since, as shown in FIG. 5, there are formed at both ends of collector region 6 the electrode mounting portions 6a which have a larger area, collector electrode 11 can be derived from either one of electrode mounting portions 6a. Thus, the degree of freedom with respect to wirings may be enhanced. Needless to say, the collector resistance can be further reduced by keeping collector electrode 11 in contact with both electrode mounting portions.

In the embodiment shown in FIG. 5, collector region 6 is arranged in a semi-circular shape with respect to emitter region 5. However, the shape and arrangement of each of regions 5, 6 and 7 are not limited to those shown in FIG. 5. Further, electrode mounting portions of respective regions 5, 6 and 7 may be provided in any portions in their regions, respectively.

In the foregoing description, the present invention has been explained employing the pnp transistor. However, it should be noted that the present invention is also applicable for other lateral type semiconductor devices such as an npn transistor and a thyristor.

Figure 7:
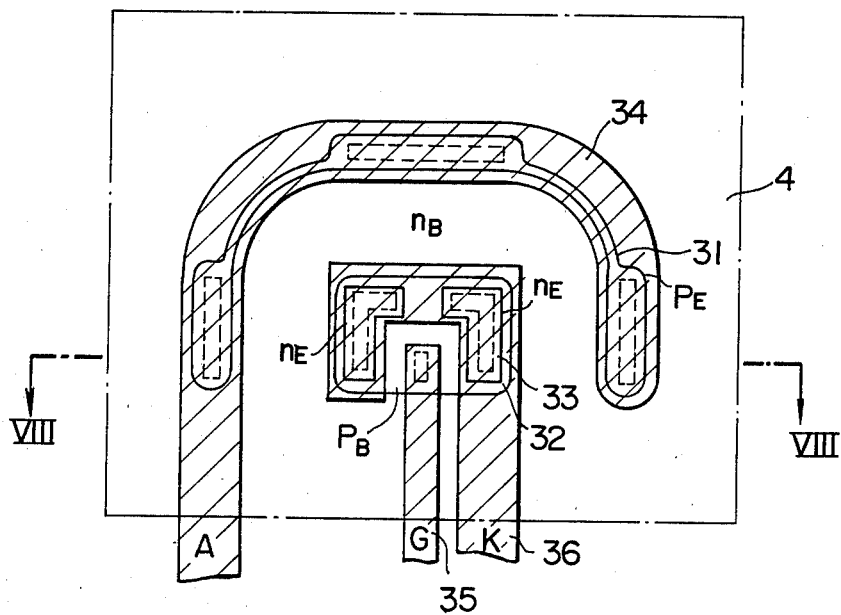
FIG. 7 is a plan view of a semiconductor integrated circuit including therein thyristors according to the present invention.
Figure 8:
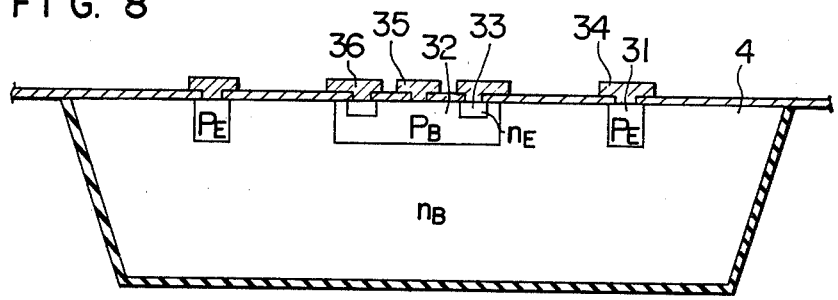
FIG. 8 is a longitudinal sectional view of the above-mentioned integrated circuit, taken along the line VIII—VIII of FIG. 7.

FIG. 7 shows another embodiment in which the present invention is applied for a thyristor. Referring to FIGS. 7 and 8, reference numerals 31, 4, 32 and 33 indicate $p_E$, $n_B$, $p_B$ and $n_E$ regions of the thyristor, respectively. The $p_B$ region is surrounded by the $p_E$ region through the $n_B$ region. Anode electrode 34, gate electrode 35 and cathode electrode 36 are attached to the $p_E$ region, $p_B$ region and $n_E$ region, respectively. In FIG. 7, hatched lines, solid lines and broken lines represent electrodes, diffusion regions and ohmic contact areas, respectively. The radius of curvature according to the present invention and the thin diffusion region of the present invention are both applied for the $p_E$ region, and the radius of curvature according to the present invention is applied for the $p_B$ region.

What is claimed is:

1. A lateral type semiconductor device, comprising:
   a semiconductor substrate,
   a reverse bias voltage means,
   a first diffusion region, having a conductivity type opposite to that of said substrate to provide a PN junction which withstands said reverse bias voltage applied therebetween, said first diffusion region forming a strip having two end portions and at least one electrode mounting portion formed to have a radius of curvature of at least 1.5 times the depth of said first diffusion region at the outward corners thereof and at least one elongated narrow portion having a width which is narrower than a width of said electrode mounting portion, and
   a second diffusion region, having the same conductivity type as said first diffusion region, formed by impurity diffusion laterally with said first diffusion region.

2. A lateral type semiconductor device in accordance with claim 1, wherein said second diffusion region is formed to have a radius of curvature of at least 1.5 times larger than the depth thereof at outward corner portions thereof in plane view.

3. A lateral type semiconductor device in accordance with claim 2, further comprising a third diffusion region, having the same conductivity type as said semiconductor substrate, formed in said second diffusion region.

4. A lateral type semiconductor device, comprising:
a semiconductor substrate,
a reverse voltage bias means,
a first diffusion region, having a conductivity type opposite to that of said substrate, formed by impurity diffusion from one of the main surfaces of said substrate to provide a PN junction which withstands said reverse bias voltage applied therebetween, said first diffusion region forming a strip having two end portions and including at least one electrode mounting portion, wherein said end portions and said electrode mounting portion are formed to have a radius of curvature at the outward corners thereof of at least 1.5 times the depth of said first diffusion region, and further wherein said strip includes at least one elongated narrow portion having a width which is narrower than a width of said electrode mounting portion, and
a second diffusion region, having the same conductivity type as said first diffusion region, formed by impurity diffusion laterally with said first diffusion region.

5. A lateral type semiconductor device in accordance with claim 4, wherein said electrode mounting portion comprises one of said end portions of said strip.

6. A lateral type semiconductor device in accordance with claim 1 or 5, wherein said electrode mounting portion comprises a portion located along said strip between said end portions.

7. A lateral type semiconductor device in accordance with claim 1 or 4, wherein said two end portions of said strip both have a width greater than the width of said elongated narrow portion of said strip.

8. A lateral type semiconductor device, comprising:
a semiconductor substrate,
a reverse voltage bias means,
a first diffusion region, having a conductivity type opposite to that of said substrate, formed by impurity diffusion from one of the main surfaces of said substrate to provide a PN junction which withstands said reverse bias voltage applied therebetween, said first diffusion region forming a strip having two end portions with at least one of said end portions being an electrode mounting portion, wherein said end portions have a radius of curvature at the outside corner thereof of at least 1.5 times the depth of said first diffusion region, and wherein said strip includes at least one elongated narrow portion having a width which is narrower than a width of said electrode mounting portion, and
a second diffusion region, having the same conductivity type as said first diffusion region, formed by impurity diffusion laterally with said first diffusion region.

9. A lateral type semiconductor device in accordance with claim 1, 6 or 8 wherein said first diffusion region is formed in a U-shaped fashion to at least partially enclose said second diffusion region within the area of said U-shape formed by said first diffusion region.

10. A lateral type semiconductor device in accordance with claim 9, wherein said first diffusion region has one elongated narrow portion, and wherein said two end portions are both electrode mounting portions which are provided respectively at opposite ends of said narrow portion.

11. A lateral type semiconductor device in accordance with claim 1, 4 or 8, wherein said first diffusion region is formed in a U-shaped fashion to at least partially enclose said second diffusion region within the area of said U-shaped formed by said first diffusion region, and wherein said second diffusion region is formed to have a radius of curvature of at least 1.5 times larger than the depth thereof at outward corner portions thereof in plane view.

12. A lateral type semiconductor device in accordance with claim 1, 4 or 8, wherein all regions of said first diffusion region other than said at least one electrode mounting portion have a width which is narrower than a width of said electrode mounting portion.

* * * * *